(12) United States Patent
Grillberger et al.

(10) Patent No.: US 7,982,313 B2
(45) Date of Patent: Jul. 19, 2011

(54) SEMICONDUCTOR DEVICE INCLUDING STRESS RELAXATION GAPS FOR ENHANCING CHIP PACKAGE INTERACTION STABILITY

(75) Inventors: Michael Grillberger, Radebeul (DE); Matthias Lehr, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/507,348

(22) Filed: Jul. 22, 2009

(65) Prior Publication Data
US 2010/0052147 A1 Mar. 4, 2010

(30) Foreign Application Priority Data
Aug. 29, 2008 (DE) .......................... 10 2008 044 984

(51) Int. Cl.
H01L 23/48 (2006.01)
H01L 23/52 (2006.01)
H01L 29/40 (2006.01)
H01L 23/053 (2006.01)
H01L 23/12 (2006.01)
H01L 27/10 (2006.01)
H01L 29/74 (2006.01)

(52) U.S. Cl. ........ 257/758; 257/211; 257/700; 257/759; 257/760; 257/E21.016; 257/E21.575

(58) Field of Classification Search ................... 257/211, 257/700, 758–760, E21.016, E21.575
See application file for complete search history.

(56) References Cited

U.S. PATENT DOCUMENTS

| | | | |
|---|---|---|---|
| 5,530,290 A | 6/1996 | Aitken et al. | 257/758 |
| 6,352,923 B1 * | 3/2002 | Hsuan et al. | 438/667 |
| 6,727,590 B2 * | 4/2004 | Izumitani et al. | 257/758 |
| 6,730,590 B2 * | 5/2004 | Ohashi et al. | 438/618 |
| 6,861,756 B2 * | 3/2005 | Saito et al. | 257/762 |
| 6,897,570 B2 * | 5/2005 | Nakajima et al. | 257/786 |
| 6,989,600 B2 * | 1/2006 | Kubo et al. | 257/758 |
| 7,087,452 B2 | 8/2006 | Joshi et al. | 438/68 |
| 7,109,093 B2 | 9/2006 | Fitzsimmons et al. | 438/427 |
| 7,253,492 B2 * | 8/2007 | Ma et al. | 257/502 |
| 7,400,046 B2 * | 7/2008 | Uchikoshi et al. | 257/758 |
| 7,525,186 B2 | 4/2009 | Kim et al. | 257/686 |
| 7,629,251 B2 * | 12/2009 | Hotta et al. | 438/637 |
| 7,642,652 B2 * | 1/2010 | Saito et al. | 257/758 |

(Continued)

FOREIGN PATENT DOCUMENTS
JP 2007-115988 8/2007

OTHER PUBLICATIONS

Translation of Official Communication from German Patent Office for German Patent Application No. 10 2008 044 984.9 dated May 29, 2009.

(Continued)

Primary Examiner — Ida M Soward
(74) Attorney, Agent, or Firm — Williams, Morgan & Amerson, P.C.

(57) ABSTRACT

By dividing a single chip area into individual sub-areas, a thermally induced stress in each of the sub-areas may be reduced during operation of complex integrated circuits, thereby enhancing the overall reliability of complex metallization systems comprising low-k dielectric materials or ULK material. Consequently, a high number of stacked metallization layers in combination with increased lateral dimensions of the semiconductor chip may be used compared to conventional strategies.

21 Claims, 6 Drawing Sheets

U.S. PATENT DOCUMENTS

| | | | |
|---|---|---|---|
| 7,737,525 B1 * | 6/2010 | Wu et al. | 257/499 |
| 7,763,948 B2 * | 7/2010 | Leedy | 257/419 |
| 2002/0160563 A1 | 10/2002 | Ghoshal | 438/214 |
| 2003/0168742 A1 * | 9/2003 | Parks | 257/758 |
| 2005/0151248 A1 | 7/2005 | Shau | 257/734 |
| 2005/0221601 A1 * | 10/2005 | Kawano | 438/622 |
| 2006/0012012 A1 | 1/2006 | Wang et al. | 257/620 |
| 2006/0145347 A1 * | 7/2006 | Aida | 257/758 |
| 2006/0163689 A1 | 7/2006 | Seo | 257/509 |
| 2006/0226547 A1 * | 10/2006 | Wang et al. | 257/758 |
| 2006/0267154 A1 | 11/2006 | Pitts et al. | 257/620 |
| 2007/0013073 A1 * | 1/2007 | Cabral et al. | 257/758 |
| 2008/0006945 A1 * | 1/2008 | Lin et al. | 257/758 |
| 2008/0105947 A1 * | 5/2008 | Kuzuhara et al. | 257/506 |
| 2008/0157284 A1 | 7/2008 | Chang et al. | 257/620 |

OTHER PUBLICATIONS

PCT Search Report from PCT/EP2009/006258 dated Jan. 15, 2010.
PCT Written Opinion from PCT/EP2009/006258 dated Oct. 7, 2010.

* cited by examiner

SEMICONDUCTOR DEVICE INCLUDING STRESS RELAXATION GAPS FOR ENHANCING CHIP PACKAGE INTERACTION STABILITY

BACKGROUND OF THE INVENTION

1. Field of the Invention

Generally, the present disclosure relates to the fabrication of integrated circuits, and, more particularly, to the techniques for reducing chip package interactions caused by thermal mismatch between the chip and the package.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with a low-k dielectric material, has become a frequently used alternative in the formation of so-called interconnect structures comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors, and the like, but is limited, owing to the increased density of circuit elements requiring an even more increased number of electrical connections, by the close proximity of the metal lines, since the line-to-line capacitance is increased in combination with a reduced conductivity of the lines due to a reduced cross-sectional area. For this reason, traditional dielectrics, such as silicon dioxide (k>3.6) and silicon nitride (k>5), are replaced by dielectric materials having a lower permittivity, which are, therefore, also referred to as low-k dielectrics, having a relative permittivity of 3 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may be affected by the provision of these materials during operation of sophisticated semiconductor devices due to an interaction between a chip and the package caused by a thermal mismatch of the corresponding thermal expansion of the different materials. For instance, in the fabrication of complex integrated circuits, increasingly a contact technology may be used in connecting the package carrier to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump structure may be formed on the last metallization layer, for instance comprised of a solder material, which may be brought into contact with respective contact pads of the package. Thus, after reflowing the bump material, a reliable electrical and mechanical connection may be established between the last metallization layer and the contact pads of the package carrier. In this manner, a very large number of electrical connections may be provided across the entire chip area of the last metallization layer with reduced contact resistance and parasitic capacitance, thereby providing the IO (input/output) capabilities which may be required for complex integrated circuits, such as CPUs, storage memories and the like. During the corresponding process sequence for connecting the bump structure with a package carrier, a certain degree of pressure and/or heat may be applied to the composite device to establish a reliable connection between each of the bumps formed on the chip and the bumps or pads that may be provided on the package substrate. The thermally or mechanically induced stress may, however, also act on the lower lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials. Moreover, during operation of the finished semiconductor device attached to a corresponding package substrate, significant mechanical stress may also occur due to a significant mismatch in the thermal expansion behavior of the silicon-based semiconductor chip and the package substrate, since, in volume production of sophisticated integrated circuits, economic constraints typically require the usage of specified substrate materials for the package, such as organic materials, which may typically exhibit a different thermal conductivity and a co-efficient of thermal expansion compared to the silicon chip. Consequently, a premature failure of the metallization system may occur, as will be described with reference to FIGS. 1a-1b in more detail.

FIG. 1a schematically illustrates a cross-sectional view of an integrated circuit 150 comprising a semiconductor die or chip 100 connected to a package substrate 170 substantially comprised of an organic material, such as appropriate polymer materials and the like, by means of a bump structure 160. The semiconductor chip 100 may typically comprise a substrate 101, for instance a silicon substrate or an SOI substrate, depending on the overall configuration of the circuit layout and performance of the integrated circuit 150. Furthermore, a silicon-based semiconductor layer 102 may typically be provided "above" the substrate 101, wherein the semiconductor layer 102 may comprise a very large number of circuit elements, such as transistors, capacitors, resistors and the like, as may be required by the desired functional behavior of the integrated circuit 150. As previously discussed, the ongoing shrinkage of critical dimensions of circuit elements may result in critical dimensions of transistors on the order of magnitude of 50 nm and significantly less in presently available sophisticated semiconductor devices produced by volume production techniques. Furthermore, the semiconductor chip 100 may comprise a metallization system 110, which, in advanced devices, may comprise a plurality of metallization layers, i.e., of device levels, in which metal lines and vias may be embedded in an appropriate dielectric material. As discussed above, at least a portion of the corresponding dielectric materials used in the various metallization layers may be comprised of materials of reduced mechanical stability in order to keep the parasitic capacitance of adjacent metal lines as low as possible. As previously explained, at least a portion of the bump structure 160 may be provided as a part of the metallization system 110, wherein corresponding bumps, for instance comprised of a solder material, may be provided on the very last metallization layer of the system 110. On the other hand, the package substrate 170 may comprise appropriately positioned and dimensioned contact pads (not shown), which may be brought into contact with the corresponding bumps in order to establish respective mechanical and electrical connections upon application of heat and/or mechanical pressure. Furthermore, the package substrate 170 may comprise any appropriate conductive lines in order to connect the bumps of the bump structure 160 with corresponding terminals, which may then establish an electrical interface to other peripheral components, such as a printed wiring board and the like. For convenience, any such conductive lines in the package substrate 170 are not shown.

During operation of the integrated circuit 150, heat may be generated within the semiconductor chip 100, for instance caused by the circuit elements formed in and above the semiconductor layer 102, which may be dissipated, for instance via the metallization system 110 and the bump structure 160 and/or via the substrate 101, depending on the overall thermal conductivity of the substrate 101. For example, the heat dissipation capability of SOI substrates may be significantly less compared to pure silicon substrates due to the reduced thermal conductivity of the buried insulating oxide layer, which may separate the semiconductor layer 102 from the remaining substrate material. Thus, a major heat dissipation path may be represented by the bump structure 160 and the package substrate 170. Consequently, a moderately high average temperature may be created in the semiconductor chip 100 and also in the package substrate 170 wherein, as previously discussed, a mismatch in the coefficient of thermal expansion between these two components may cause a significant mechanical stress. As is, for instance, indicated by arrows 103 and 173, the package substrate 170 may exhibit an increased thermal expansion compared to the semiconductor chip 100, wherein a corresponding mismatch may therefore result in a significant degree of thermal stress, in particular at the "interface" between the semiconductor chip 100 and the package substrate 170, that is, in particular the bump structure 160 and the metallization system 110 may experience significant shear forces caused by the thermal mismatch during the operation of the integrated circuit 150. Due to the reduced mechanical stability and the reduced adhesion of sophisticated dielectric materials, corresponding defects may occur which may affect the overall reliability of the integrated circuit 150.

FIG. 1*b* schematically illustrates an enlarged view of a portion of the metallization system 110 during a typical situation when operating the integrated circuit 150. As illustrated, the metallization system 110 may comprise a plurality of metallization layers, wherein, for convenience, two metallization layers 120 and 130 are illustrated. For example, the metallization layer 120 may comprise a dielectric material 121, in which corresponding metal lines 122 and vias 123 may be embedded. Similarly, the metallization layer 130 may comprise a dielectric material 131 and respective metal lines 132 and vias 133. Furthermore, typically, the metallization layers 120, 130 may comprise etch stop/capping layers 124, 134, respectively, which may be provided in the form of an appropriate material having desired characteristics with respect to etch stop capabilities, confining copper and the like. Moreover, as previously explained, at least some of the metallization layers in the metallization system 110 may comprise a sensitive dielectric material in the form of a low-k dielectric material or a ULK material which may exhibit a significantly reduced mechanical stability compared to other dielectrics, such as silicon nitride, silicon carbide, nitrogen-containing silicon carbide, which may frequently be used as the etch stop/capping layers 124, 134. Consequently, during operation of the integrated circuit, due to the different behavior with respect to thermal expansion, as indicated by arrows 103, 173 (FIG. 1*a*), a significant mechanical stress may be transferred into the metallization layers 120, 130, as indicated by 103A. Consequently, the mechanical stress 103A may also prevail in the dielectric materials 131 and 121, thereby inducing a more or less pronounced strained state, which may result in the creation of defects 121A, 131A, which may finally result in a certain degree of delamination from the lower lying materials 124, 134, respectively, since the adhesion of ULK dielectric materials, such as the materials 121, 131, to the etch stop/capping layers 124, 134 may be reduced compared to conventional dielectric materials, such as silicon dioxide and the like. Consequently, the resulting delamination may finally result in a premature failure of the metallization system 110, thereby contributing to a reduced overall reliability of the integrated circuit 150 (FIG. 1*a*).

The problem of a reduced reliability of sophisticated metallization systems is even further exacerbated in advanced process technologies in which the dielectric constant of the corresponding inter-metal dielectrics may further be reduced, while at the same time the dimensions of the corresponding chip areas may be increased in order to even further enhance the overall functionality of integrated circuits. On the other hand, the increased complexity of the overall circuit layout may also require an increase of the number of stacked metallization layers, as previously explained, which may additionally result in a reduced mechanical stability, thereby even further contributing to a reduced reliability of complex integrated circuits. Furthermore, providing the bump structure 160 (FIG. 1*a*) may result in moderately tight mechanical coupling of the package substrate and the semiconductor chip, which may therefore "efficiently" transfer the resulting mechanical stress into the metallization layers provided below the bump structure 160 so that the weak components, i.e., the low-k dielectric materials, may have to accommodate significant mechanical stress forces which may periodically occur, in particular when a cycled operational mode may be used during the operation of the integrated circuit 150.

For this reason, in conventional approaches with respect to performance driven metallization systems including sophisticated dielectric materials, the overall size of the semiconductor chip has to be restricted to appropriate dimensions so as to maintain the overall mechanical stress components at an acceptable level. In other cases, the number of metallization layers may be restricted, thereby also restricting the packing density and/or the complexity of the circuit layout. In still other conventional approaches, less sophisticated dielectric materials may be used in order to enhance the overall mechanical stability, thereby sacrificing performance of the integrated circuits.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which reliability of metallization systems may be increased while nevertheless providing a desired number of metallization levels including sophisticated dielectric materials. For this purpose, a single die region may be "divided" into two or more parts that may be mechanically decoupled to a certain degree so that any used stress components may act on the two or more parts of appropriate size so as to accommodate the existing mechanical stress conditions while nevertheless providing the required reliability. Dividing a single chip area into two or more parts of reduced mechanical interaction while still maintaining the electrical connection between the individual parts may be accomplished, in some illustrative aspects disclosed herein, by providing stress relaxation regions or "expansion" gaps, which may extend through one or more metallization layer and which may even extend, in some illustrative embodiments disclosed herein, into or through the substrate of the semiconductor chip. The stress relaxation regions may have different characteristics, for instance with respect to thermal expansion, elasticity and the like, compared to the semiconductor device so that a corresponding "decoupling" may be achieved, for instance during operation of the semiconductor device, on the basis of a respective package substrate having a thermal mismatch with respect to the semiconductor chip and/or during certain manufacturing stages, such as packaging and connecting of a bump structure to a package substrate, thereby reducing the probability of creating defects, which may cause a significant reduction of reliability in conventional approaches. Consequently, the desired degree of electrical performance and/or complexity of the circuit layout under consideration may be maintained, while nevertheless providing enhanced reliability on the basis of a mechanical decoupling of at least two parts of a single semiconductor chip.

One illustrative semiconductor device disclosed herein comprises a substrate and a semiconductor material formed above the substrate. Furthermore, the semiconductor device comprises a plurality of circuit elements formed in and above the semiconductor material and a metallization system formed above the plurality of circuit elements, wherein the metallization system comprises one or more metallization layers and a final contact layer configured to connect to a package substrate. Additionally, the semiconductor device comprises a stress relaxation region provided at least in the metallization system, wherein the stress relaxation region divides the metallization system in at least a first part and a second part and the stress relaxation region comprises a metal line portion in at least one of the one or more metallization layers so as to electrically connect the first part and the second part.

A further illustrative semiconductor device disclosed herein comprises a substrate and a plurality of transistor elements formed in and above a semiconductor material located above the substrate. Furthermore, a plurality of stacked metallization layers is provided, wherein at least one of the metallization layers comprises metal lines formed in a low-k dielectric material. Finally, the semiconductor device comprises an expansion gap extending through each of the plurality of stacked metallization layers, wherein the expansion gap extends into the substrate.

One illustrative method disclosed herein relates to the formation of a semiconductor device. The method comprises forming one or more metallization layers above a semiconductor layer that comprises a plurality of transistor elements. Additionally, the method comprises forming at least one trench extending through at least one of the one or more metallization layers, wherein the trench divides at least one of the one or more metallization layers into a first part and a second part.

BRIEF DESCRIPTION OF THE DRAWINGS

The disclosure may be understood by reference to the following description taken in conjunction with the accompanying drawings, in which like reference numerals identify like elements, and in which.

Figure 1A:
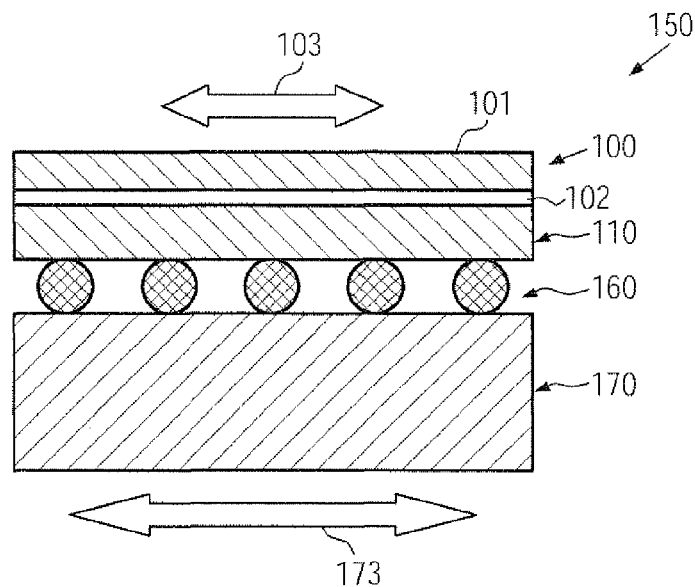
FIG. 1a schematically illustrates a cross-sectional view of an integrated circuit including a semiconductor chip and a package substrate connected by a bump structure, according to conventional designs.
Figure 1B:
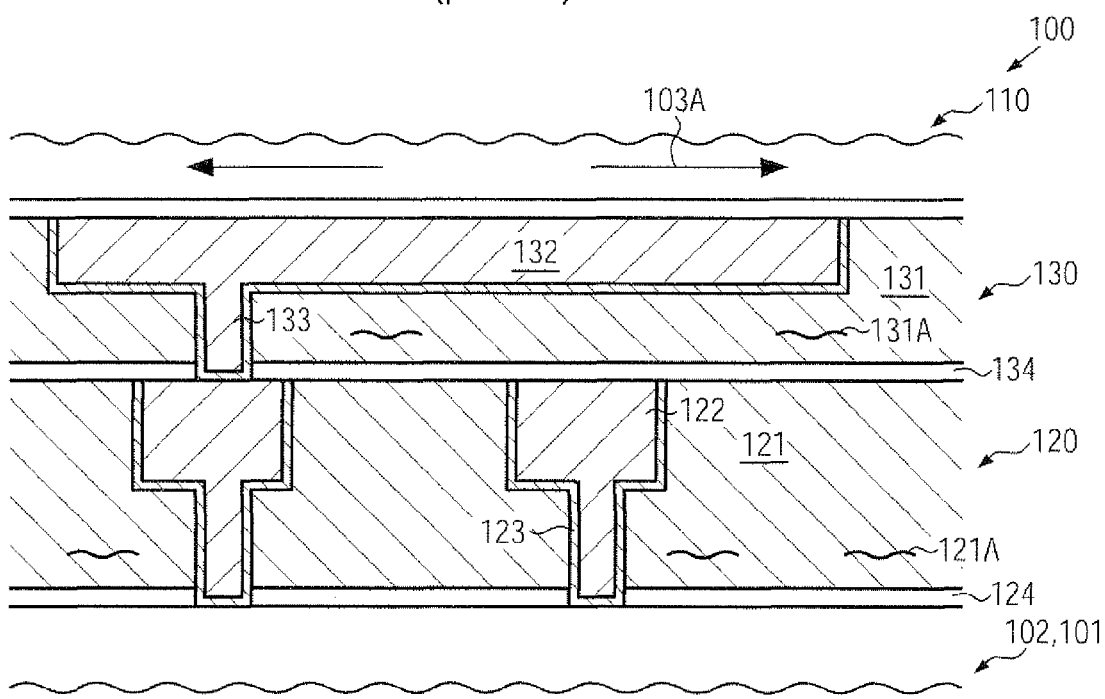
FIG. 1b schematically illustrates an enlarged view of a portion of the metallization system of the semiconductor chip including sensitive dielectric materials provided in accordance with conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of reduced reliability of metallization systems in advanced semiconductor devices, which may be caused by mechanical stress exerted to the metallization system during certain manufacturing phases and in particular during operation of the integrated circuit, when connected to a package substrate having a different coefficient of thermal expansion compared to the coefficient of thermal expansion of the semiconductor chip. For this purpose, the principles disclosed herein contemplate a "reduction" of the effective size of the semiconductor chip with respect to mechanical stress forces while maintaining a desired increased chip dimension with respect to the electrical behavior. That is, the chip size may be selected in accordance with the requirements as demanded by the desired complex overall circuit layout, wherein also a certain amount of chip area may be reserved for the provision of zones or regions, which may "mechanically" divide the die region into two or more sub-areas, while nevertheless maintaining electrical integrity of the die area as a whole. Consequently, these regions, which may also be referred to as expansion gaps, stress relaxation regions, mechanical decoupling regions and the like, may allow the individual sub-areas to respond to a mechanical stress, which may, for instance, be caused by a mismatch of the thermal expansion coefficients, with a significantly reduced effect on neighboring sub-areas separated by the stress relaxation region. Consequently, the size of each individual sub-area may be maintained below a critical size, above which an unacceptable loss of reliability may be observed for otherwise given requirements with respect to the number of metallization layers, the dielectric materials used therein and the like. On the other hand, the electrical "unity" of the entire die area may be preserved by appropriately providing metal lines between the individual sub-areas, which, however, may be configured to withstand a certain degree of volume contraction or expansion, which may be caused by mechanical stress and/or thermal conditions during the manufacturing sequence and/or during the operation of the device. In some illustrative embodiments the corresponding stress relaxation region may be provided, at least within critical metallization layers, so as to restrict the magnitude of any occurring mechanical stress caused, for instance, by a thermal mismatch between the semiconductor chip and the attached package substrate, while, in other cases, the stress relaxation region may extend through the entire metallization system and into or even through the substrate material of the semiconductor chip. In some illustrative embodiments, the stress relaxation region may be filled with an appropriate material so as to obtain the desired response of the various sub-areas with respect to thermal and mechanical stress. That is, the corresponding fill material may have different characteristics compared to the initial materials of the semiconductor chip, for instance with respect to elasticity, coefficient of thermal expansion, thermal conductivity and the like. In this manner, the characteristics of the stress relaxation regions may be adapted in accordance with device and process requirements, wherein different regions may be provided with different characteristics, if required, or wherein, even within a single relaxation region, fill materials with different characteristics may be provided. For instance, a fill material having similar thermal expansion characteristics compared to a package substrate may be used, for instance in the form of an organic fill material, thereby providing a lateral stress component, which may to a certain degree counteract a corresponding mechanical stress component that may be induced in the metallization system, as previously explained. That is, during an increased thermal expansion of the package substrate, a corresponding tensile stress induced in the metallization layers may be compensated for to at least a certain degree by the corresponding compressive stress exerted from the stress relaxation region, i.e., the corresponding fill material contained therein. As previously indicated, the characteristics of the fill material may be varied, for instance along the depth direction, so as to specifically design a corresponding "response" of the relaxation region with respect to specific device levels. For instance, while in upper portions of the metallization system, a compressive behavior of the fill material may be provided in lower device levels or within the substrate, enhanced thermal and/or electrical conductivity of the fill material may be considered advantageous, for instance, for enhancing the overall thermal characteristics of SOI substrates, when the fill material of enhanced thermal conductivity may extend through the buried insulating layer. In other cases, at least a portion of the fill material may be used as electrical contacts connecting various device levels or for enhancing electrical immunity of various sub-areas by using an electrically conductive fill material as an efficient shield. For example, high performance sub-areas of the semiconductor chip, such as logic portions including circuitry with high switching speed and the like, may be efficiently shielded by providing a conductive fill material in a stress relaxation region that substantially completely laterally encloses the critical sub-area. In other cases, in at least portions of the stress relaxation regions, an electrically active structure may be implemented, such as a capacitive structure, which may respond to mechanical and thermal stress, thereby enabling an effective monitoring of the status of various sub-areas. In other cases, appropriate decoupling capacitors may be established on the basis of the fill material and a corresponding configuration of the stress relaxation regions. Consequently, in addition to the mechanical characteristics, in some illustrative embodiments, additional functions, such as enhanced heat dissipation, shielding of switching noise, thermal sensing applications and the like, may be implemented by means of stress relaxation regions or at least portions thereof. Thus, in addition to enhanced reliability for a given configuration of a metallization system and complexity of the circuit layout under consideration, overall enhanced performance may be obtained.

Figure 2A:
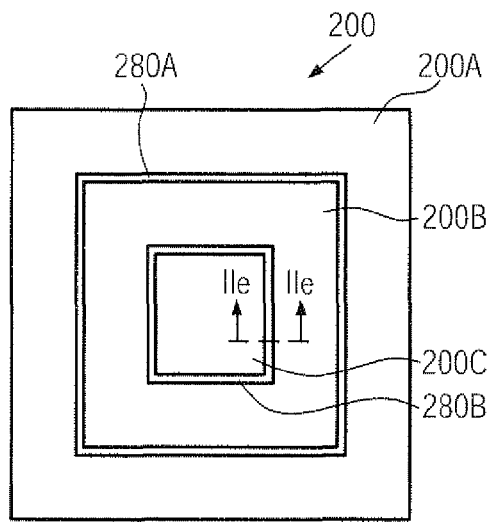
FIGS. 2a-2b schematically illustrate top views of semiconductor chips including respective stress relaxation regions, also referred to as expansion gaps, that may define respective sub-areas of reduced dimensions and with reduced mutual mechanical interaction with each other, according to illustrative embodiments.

FIG. 2a schematically illustrates a top view of a semiconductor chip 200 having specified lateral dimensions to accommodate one or more functional circuit units in accordance with a given circuit layout. That is, the semiconductor chip 200 may be dimensioned such that a large number of circuit elements may be formed therein in order to obtain electrical performance required by a given circuit configuration. Furthermore, the overall configuration of the semiconductor chip 200, for instance with respect to the architecture of the metallization system (not shown in FIG. 2a) and the like, may be selected so as to obtain a desired level of performance, for instance by providing one or more of the corresponding metallization layers (not shown) with sophisticated dielectric materials, such as low-k dielectrics, ULK materials and the like, as is also previously explained. It should be appreciated that the semiconductor chip 200 may comprise a higher number of circuit elements, thereby providing an increased degree of complexity of corresponding functional units, with a given standard of electrical performance compared to conventional semiconductor devices, since the lateral dimensions of the chip 200 may not be restricted by the thermal performance in combination with a corresponding package substrate, as is the case in conventional approaches, wherein, for a given technology standard of the metallization system, i.e., the number of the metallization layers and the configuration thereof with respect to the dielectric materials used therein, has to be restricted in view of the required degree of reliability of the metallization system. For this purpose, in some illustrative embodiments, the semiconductor chip 200 may be "divided" into two or more sub-areas 200A, 200B, 200C on the basis of one or more stress relaxation regions 280A, 280B. That is, as previously explained, the regions 280A, 280B may provide a certain degree of mechanical decoupling effects with respect to adjacent sub-areas, thereby enhancing the response to thermally induced stress components, which may directly translate into enhanced reliability of the corresponding metallization system of the semiconductor chip 200. For instance, the regions 280A, 280B may represent trenches which may, at least partially, be filled with an appropriate material that enables a response of the individual areas 200A, 200B, 200C with respect to mechanical stress without significantly affecting a neighboring sub-area. For instance, a corresponding fill material may adhere to the adjacent sub-areas while nevertheless providing a certain degree of elasticity so that the corresponding sub-areas may contract or expand without significant influence on the adjacent sub-areas due to the buffering effect of the regions 280A, 280B. In the example shown, the stress relaxation region 280B may enable a response of the sub-area 200C with respect to thermally or mechanically induced stress by expansion or contraction, substantially without significantly affecting the adjacent sub-area 200B, which in turn may individually expand or contract without creating a significant mechanical stress to the adjacent sub-areas 200A, 200C. Consequently, if the semiconductor chip 200 is attached to a package substrate, the sub-areas 200A, 200B, 200C may individually follow the thermally induced contraction or expansion of the package substrate while at the same time maintaining the resulting stress component at a level that is compatible with the mechanical capabilities of the metallization system of the chip 200.

On the other hand, the electrical integrity of the chip 200 as a whole may be maintained by maintaining respective electrical connections between the various sub-areas 200A, 200B, 200C, as will be explained later on with reference to FIGS. 2c-2d. In some illustrative embodiments, with respect to electrical connections, the sub-areas 200A, 200B, 200C may be selected such that these areas may represent functional units of the entire circuit of the chip 200, wherein merely a moderately low number of electrical connections may have to be established between various functional units represented by the areas 200A, 200B, 200C. For example, a memory area of a sophisticated integrated circuit, such as a CPU, may be considered as a functional unit which may be separated from other sub-areas, such as a CPU core, power electronics and the like, by one of the regions 280A, 280B. In other cases, the configuration of the regions 280A, 280B and thus of the sub-areas 200A, 200B, 200C, may be selected with respect to other criteria, such as the "density" of metal lines in the metallization system, wherein a reduced density of metal lines may be considered advantageous for positioning therein one of the regions 280A, 280B, temperature distribution within the chip 200 during operation, the provision of additional thermal and/or electrical functions at specific areas of the chip 200 and the like. For instance, as previously indicated, at least a portion of the regions 280A, 280B may also be used for enhancing overall thermal conductivity, in particular in SOI devices, so that one or more of the areas 200A, 200B, 200C may represent areas of increased heat generation during operation.

Figure 2B:
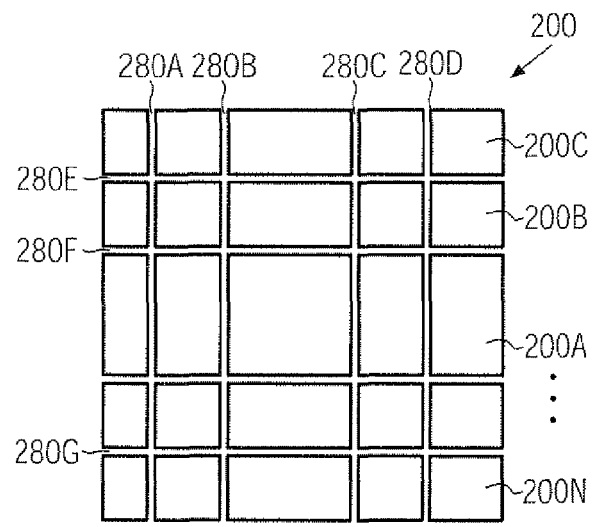

FIG. 2b schematically illustrates the semiconductor chip 200 with a moderately high number of sub-areas 200A . . . 200N defined by a corresponding network of stress relaxation regions 280A . . . 280G. As illustrated, the size and shape of the various sub areas 200A . . . 200N may be individually adjusted by the regions 280A . . . 280G in accordance with overall device requirements.

Figure 2C:
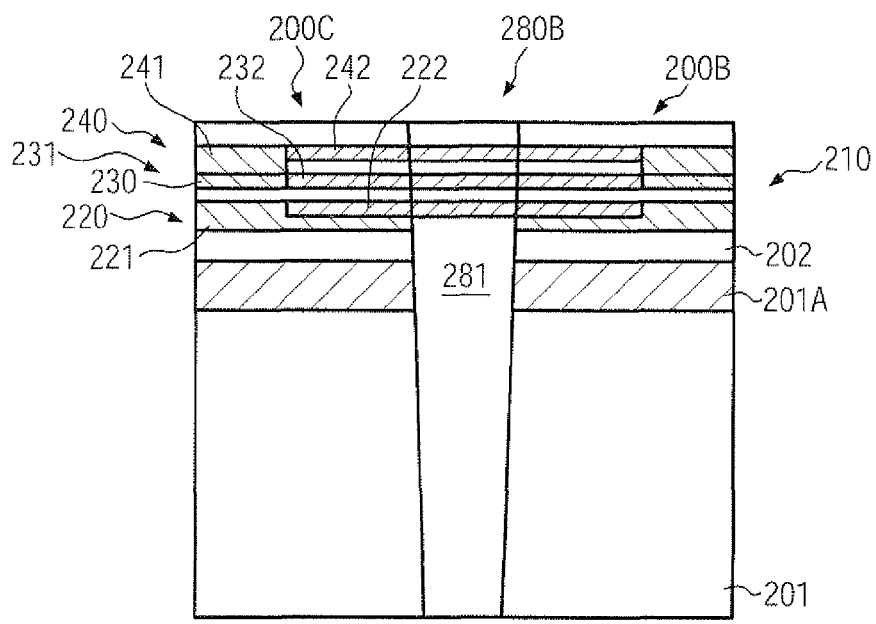
FIG. 2c schematically illustrates a cross-sectional view of a semiconductor chip comprising a stress relaxation region or decoupling region in order to provide two or more parts of the semiconductor chip having a reduced dimension in order to reduce the probability of creating defects in the metallization system, according to illustrative embodiments disclosed herein.

FIG. 2c schematically illustrates a cross-sectional view of a portion of the semiconductor chip 200 according to the section IIe of FIG. 2a. As illustrated, the chip 200 may comprise a substrate 201, which may represent any appropriate carrier material for forming thereabove a semiconductor layer 202, in and above which circuit elements, such as transistors, capacitors and the like, may be formed. For example, the substrate 201 may represent a silicon substrate which may comprise, at least in some areas of the chip 200, a buried insulating layer 201A when an SOI configuration is considered. It should be appreciated, however, that the principles disclosed herein may also be applied to any appropriate chip configuration in which a semiconductor layer may be formed above an appropriate carrier material. Moreover, the semiconductor chip 200 may comprise a metallization system 210 that may have a desired configuration, for instance, with respect to the number of metallization layers, the type of dielectric material incorporated therein and the like. For instance, the metallization system 210 may comprise a plurality of metallization layers 220, 230, 240, each of which may include a plurality of metal lines and vias to provide the electrical connections of circuit elements positioned within the sub-areas 200C, 200B. For convenience, any such metal lines and vias are not shown in FIG. 2c. At least some of the metallization layers 220, 230, 240 may comprise sophisticated dielectric materials, as previously explained. For instance, each of the metallization layers 220, 230, 240 may comprise a dielectric material 221, 231, 241, respectively, which may include a low-k dielectric material or a ULK material. Furthermore, at least some of the metallization layers 220, 230, 240 may comprise a metal line 222, 232, 242, respectively, to electrically connect the sub-area 200C with the sub-area 200B across the stress relaxation region 280B. It should be appreciated that corresponding interconnect structures for connecting the metal lines 222, 232, 242 with circuit elements in the device layer 202 of the areas 200C, 200B are not shown in FIG. 2c.

Furthermore, the chip 200 may comprise the region 280B, which may extend through the entire metallization system 210, the semiconductor level 202 and the substrate 201, which may possibly comprise the buried insulating layer 201A. In other illustrative embodiments, as will be explained later on, the region 280B may extend to a specific depth, if a mechanical decoupling or a discontinuation of a lateral stress transfer may be considered appropriate within specific device levels only. The region 280B may represent a trench which may be filled with an appropriate fill material 281 providing the desired characteristics with respect to the mechanical decoupling. For instance, a plurality of polymer materials may be available in the art, which may provide sufficient adhesion to the areas 200C, 200B in order to maintain a certain degree of mechanical stability of the chip 200 during the further processing, while nevertheless enabling a certain degree of individual expansion and contraction of the areas 200C, 200B, as previously explained. In some illustrative embodiments, the fill material 281 may be provided in the form of a material having a thermal expansion coefficient that is close to the coefficient of the material of a package substrate to be connected to the semiconductor circuit 200 in a later manufacturing stage. In other cases, a material of enhanced elasticity may be used, while, in other cases, additionally or alternatively, a fill material of enhanced thermal conductivity may be provided, at least up to a certain height level within the region 280B. For example, in case of an SOI configuration, the heat dissipation capability of the substrate 201 may be significantly enhanced by providing a material of enhanced thermal conductivity within the region 280B, at least for the portions extending from the semiconductor layer 202 into the substrate 201 through the buried insulating layer 201A. Thus, the generally inferior thermal behavior of SOI devices may be significantly enhanced by providing the region 280B with an appropriate fill material 281 having an enhanced thermal conductivity.

Figure 2D:
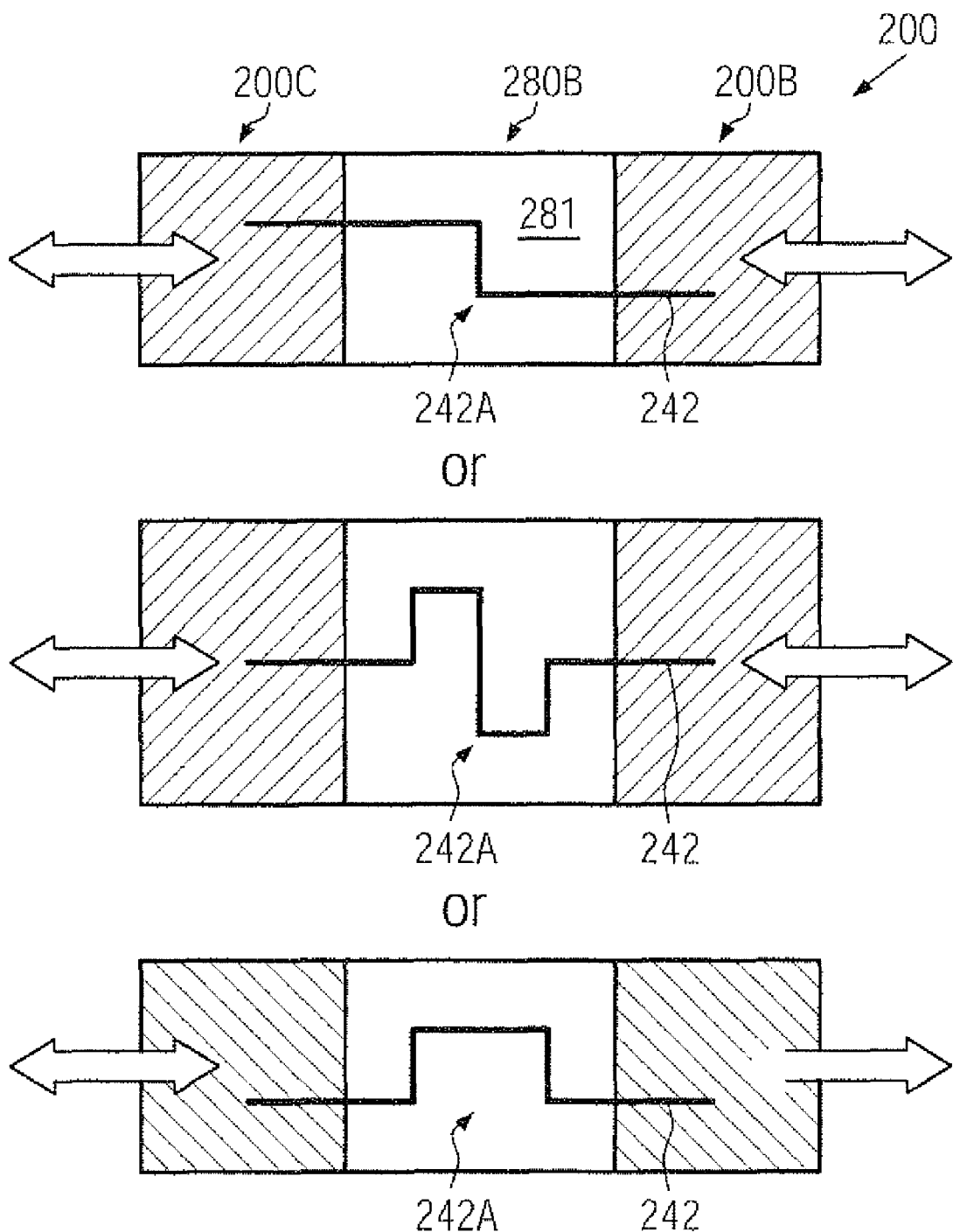
FIG. 2d schematically illustrates a top view of a portion of the stress relaxation region, wherein a plurality of variants for electrically connecting to sub-parts on the basis of a non-linear configuration of metal lines are demonstrated, according to further illustrative embodiments.

FIG. 2d schematically illustrates views of various variants for designing the metal lines 222, 232, 242 connecting the sub-areas 200C and 200B. That is, the metal lines 222, 232, 242 may comprise a non-linear line portion extending across the region 280B, which may enable following mechanical displacements between the regions 200C, 200B without negatively affecting the electrical connection. As illustrated, any type of "bent" configuration may be used for the non-linear line portion 242A within the region 280B so as to provide the desired "flexibility" of the metal line 242 and also for the metal lines 232, 222, which are not shown in FIG. 2d.

Figure 2E:
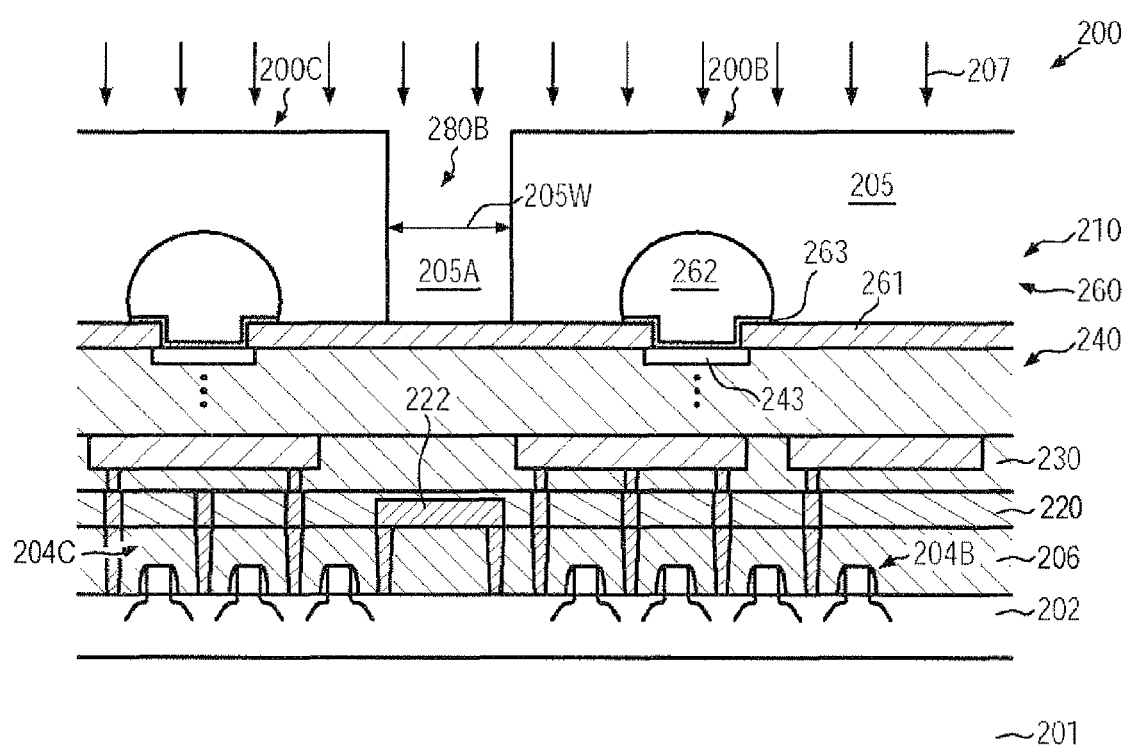
FIG. 2e schematically illustrates a cross-sectional view of a portion of a semiconductor chip comprising a complex metallization system during a manufacturing phase for forming a trench extending through the metallization system, according to further illustrative embodiments.

FIG. 2e schematically illustrates a further cross-sectional view along the section IIe of FIG. 2a. As illustrated, the semiconductor device 200 may comprise the substrate 201, the device layer 202 and the metallization system 210. The metallization system 210 may have as a last metallization layer a bump structure 260, which may be designed so as to connect to a package substrate, as is also explained with reference to the integrated circuit 150 (FIG. 1a). For example, the bump structure 260 may comprise an appropriate dielectric material 261 and corresponding bumps 262, which may be formed on an appropriate "under-bump" metal 263, which in turn may be connected to a metal region 243 of the metallization layer 240. As previously indicated, the metallization system 210 may comprise any number of metallization layers wherein, for convenience, three layers 220, 230, 240 are shown. The metallization system 210 may provide the electrical connection of circuit elements 204C positioned in the sub-area 200C and circuit elements 204B positioned in the sub-area 200B. Furthermore, the metallization system 210 may comprise appropriate metal lines and interconnect structures to electrically connect the sub-areas 200C, 200B, as is previously explained. For convenience, a single metal line 222 is illustrated to provide the electrical connection across an area in which the region 280B is to be formed on the basis of a corresponding etch mask 205.

The semiconductor device 200 as shown in FIGS. 2a-2e may be formed on the basis of the following processes. The circuit elements 204C, 204B and any other circuit elements in other areas are formed by appropriately defining the position of these circuit elements with respect to grouping the semiconductor device 200 into the sub-areas 200A, 200B, 200C (see FIGS. 2a-2b), as previously explained. The manufacturing sequence for forming the circuit elements 204C, 204B may include any appropriate techniques to form the circuit elements with a desired electrical behavior and with the critical dimensions as demanded by the design rules. For instance, in sophisticated applications, critical dimensions of the circuit elements 204C, 204B, such as a gate length of field effect transistors and the like, may be approximately 50 nm and less. Thereafter, an appropriate contact structure 206 may be formed to represent an interface between the circuit elements 204C, 204B and the metallization system 210. Next, the various metallization layers 220, 230, 240 may be formed, wherein appropriate process techniques in combination with desired materials, such as low-k dielectric materials, may be used. Furthermore, the connecting metal lines, such as line 222, may be provided with a non-linear portion at the area corresponding to the region 280B so as obtain the desired mechanical "elasticity" of the electrical connections between the areas 200C, 200B. Finally, the bump structure 260 may be formed as the final metallization layer of the system 210, wherein appropriate process techniques may be applied, thereby also appropriately selecting the position of the bumps 262 so as to not interfere with the region 280B. Next, the etch mask 205 may be provided in the form of a resist mask, possibly in combination with a hard mask material, such as silicon nitride, silicon dioxide and the like. The mask 205 may have an opening 205A so as to define the lateral dimensions of the region 280B. For example, a width 205W may be in the range of several μm to several tenths of μm, depending on the expected thermal expansion or contraction of the areas 200C, 200B, which may also depend on the size of the individual sub-areas.

In other illustrative embodiments when the provision of the etch mask 205 may not be compatible with the presence of the bumps 262, the mask 205 may be provided prior to forming the bumps 262, and the corresponding process sequence 207 for etching through the metallization system 210 and possibly through the device layer 202 and into the substrate 201 and the subsequent refilling of the corresponding trench may be performed prior to forming the bumps 262. During the process sequence 207, an anisotropic etch recipe may be used, which may be based on fluorine or fluorine comprising etch chemistries in order to etch through the dielectric materials selectively with respect to any metal lines, such as the line 222, which may be capped by an appropriate conductive or dielectric etch stop material, which may thus ensure integrity of the metal line 222 during the corresponding etch process. For instance, a plurality of conductive cap materials may have a high etch resistance with respect to a plurality of well-established plasma assisted etch recipes, wherein also copper per se may be difficult to be etched by plasma assisted etch techniques thereby obtaining the desired etch selectivity. In other cases, the sequence 207 for etching and refilling the corresponding region 280B may be performed as a sequence of a plurality of process steps so as to relax any constraints imposed on the corresponding patterning sequence, as will be described later on. Thus, after etching a corresponding trench down to a specified depth or completely through a substrate 201, an appropriate fill material may be deposited, for instance by CVD techniques, spin-on techniques and the like, depending on the characteristics and the type of material to be filled in.

Figure 2F:
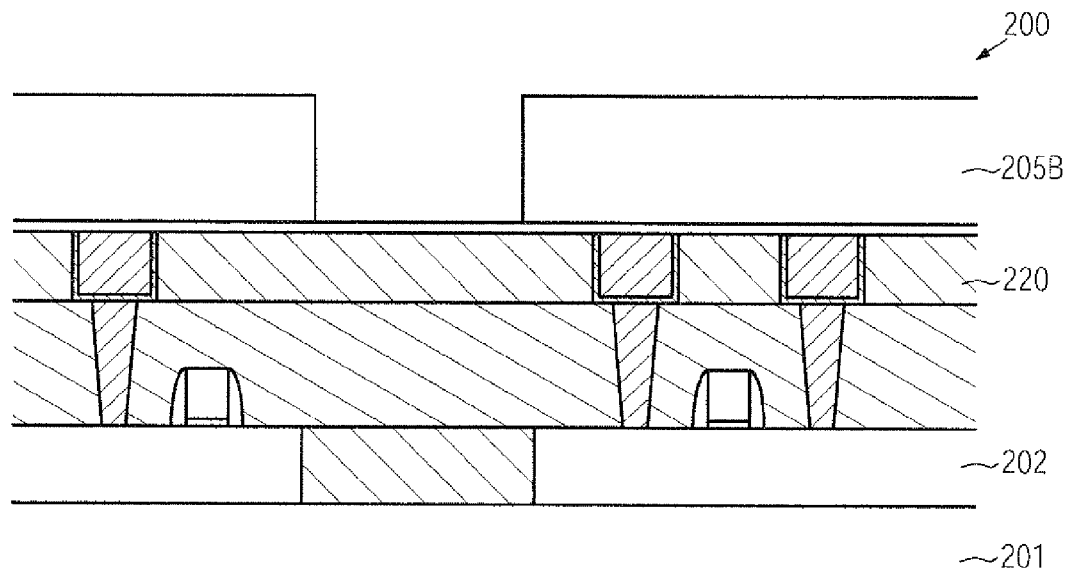
FIGS. 2f-2g schematically illustrate cross-sectional views of a semiconductor device during various manufacturing stages in forming a stress relaxation region in several steps so as to reduce the complexity of the corresponding etch process, according to further illustrative embodiments.

FIG. 2f schematically illustrates the semiconductor device 200 according to further illustrative embodiments in which the region 280B may be formed in several steps. As illustrated, after forming one or more metallization layers, such as the metallization layer 220, a mask 205B may be provided in order to etch at least through the metallization layer 220 and possibly through the device layer 202 so that control of the etch process may be enhanced compared to process techniques in which a moderately high number of device levels may have to be etched.

Figure 2G:
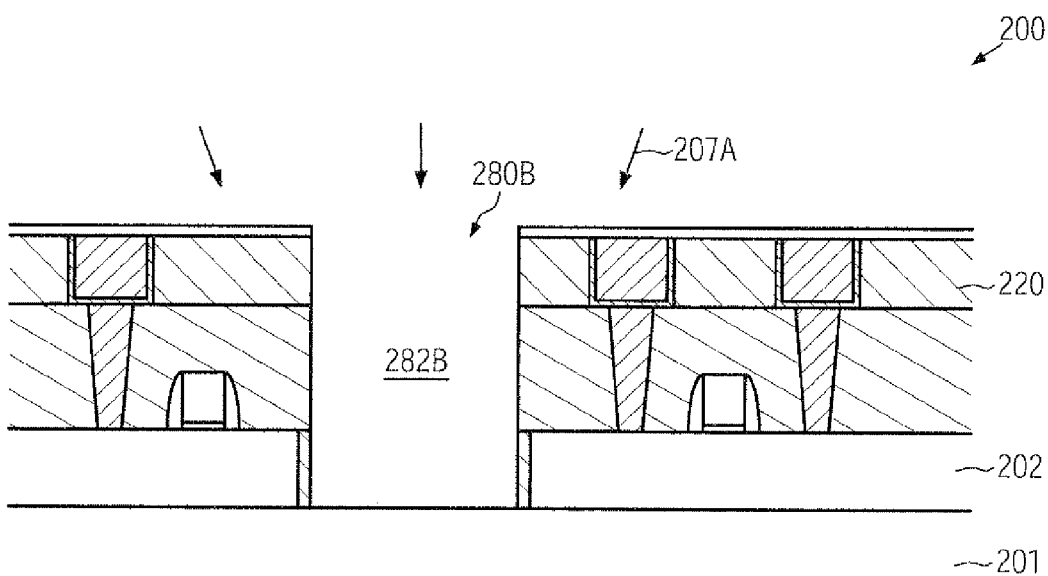

FIG. 2g schematically illustrates the semiconductor device 200 after etching a trench 282B into the metallization layer 220, which may extend to the substrate 201 or which may extend into or through the substrate 201, as is required by the overall configuration of the region 280B. Thereafter, a corresponding deposition process 207A may be performed so as to refill the trench 282B with an appropriate fill material, as previously discussed. It should be appreciated that the process 207A may include a plurality of deposition processes, possibly in combination with etch processes, depending on the characteristics of the fill material. For instance, a material of enhanced thermal conductivity may be filled into a lower portion of the trench 282B, in particular when the trench 282B may extend through a buried insulating layer, as is previously explained. If another type of material may have to be filled into the trench 282B, any excess material may be removed, for instance by a respective etch process, and subsequently a different fill material may be deposited. In other cases, a conductive material may be deposited, for instance on sidewall portions of the trench 282B by performing a conformal deposition process with a subsequent deposition of a dielectric material, wherein also a portion of the previously deposited conductive material may be removed so as to not interfere with the electrical behavior of the metallization layer 220, if desired. In this case, the region 280B may also provide an enhanced shielding effect with respect to electromagnetic immunity. In other cases, a corresponding conductive material may be removed from the bottom of the trench 282B so that a capacitive structure may be obtained, which may be used for electrical monitoring tasks, charge storage and the like.

After refilling the trench 282B, the further processing may be continued by forming additional metallization layers and repeating a corresponding manufacturing sequence as described above to provide a further portion of the region 280B on the basis of relaxed process conditions.

Figure 2H:
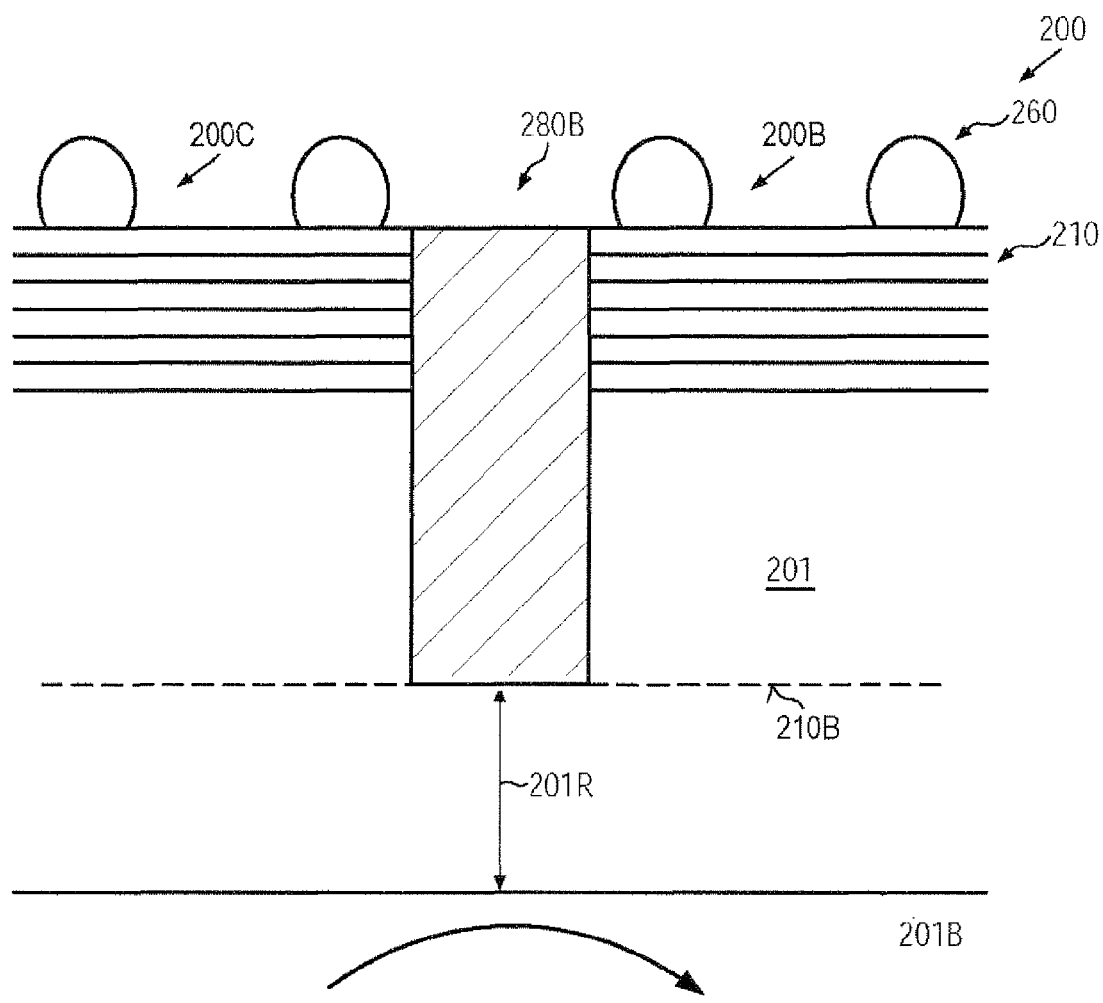
FIG. 2h schematically illustrates a cross-sectional view of the semiconductor device comprising an expansion gap or stress relaxation region extending into the semiconductor substrate, wherein mechanical decoupling may be enhanced by removing material of the back side of the substrate at a final manufacturing stage, according to still further illustrative embodiments.

FIG. 2h schematically illustrates a cross-sectional view of the semiconductor device 200 in an advanced manufacturing stage according to still further illustrative embodiments. As illustrated, the region 280B may extend through the metallization system 210 and into the substrate 201, wherein, however, a residual thickness 210R of the substrate 201 may be maintained in order to provide enhanced mechanical integrity of the semiconductor device 200 during the processing and handling of the substrate 201. That is, during the corresponding handling activities for etching a trench for the region 280B, refilling the trench and the like, the residual thickness 210R may provide enhanced integrity even if the fill material of the region 280B may have an increased elasticity, as may be desirable for mechanically decoupling the areas 200C, 200B during operation of the device 200 when attached to a package substrate. Thus, at a final phase in the overall manufacturing sequence prior to dicing the substrate 201, the residual thickness 210R may be reduced so as to "expose" the region 210B from the back side 201B of the substrate 201. For this purpose, an appropriate grinding process may be performed and/or an etch process may be used, for which well-established etch recipes or polishing recipes are available. In this manner, the region 280B may extend completely through the remaining substrate 201, while also the reduced thickness thereof may provide enhanced electrical and thermal performance. Furthermore, the efficiency of the mechanical decoupling effect provided by the region 280B may also be enhanced by reducing the thickness of the substrate 201. Thereafter, the further processing may be continued by dicing the substrate 201 to separate individual semiconductor chips and attaching the chips to appropriate package substrates, as is, for instance, described with reference to FIG. 1a.

As a result, the present disclosure provides semiconductor devices, integrated circuits and techniques for forming the same in which an enhanced reliability of the metallization system may be accomplished by dividing an individual semiconductor chip into two or more sub-areas, which may be separated by an appropriate expansion gap or stress relaxation region, which may limit the amount of mechanical stress that may occur during operation of an integrated circuit comprising the semiconductor chip including the plurality of individual sub-areas and a corresponding package substrate. In this manner, complex metallization systems on the basis of low-k dielectric materials with a required high number of metallization levels may be used, substantially without being restricted to a specific moderately low overall lateral dimension of the semiconductor chip, as is the case in conventional techniques. Thus, for a given electrical performance, more functions may be incorporated into a single semiconductor chip without sacrificing reliability of the metallization system compared to conventional devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a first plurality of circuit elements and a second plurality of circuit elements formed in and above a device substrate comprising a semiconductor material;
a metallization system formed above said first and second pluralities of circuit elements, wherein said metallization system comprises one or more metallization layers and a final contact layer adapted to connect to a package substrate;
a stress relaxation region provided at least in said metallization system, wherein said stress relaxation region defines a first sub-area of said metallization system formed above said first plurality of circuit elements and separates said first sub-area from at least a second sub-area of said metallization system formed above said second plurality of circuit elements; and
a metal line portion formed in at least one of said one or more metallization layers, wherein said metal line portion extends across said stress relaxation region from said first sub-area to said second sub-area so as to electrically connect at least one of said first plurality of circuit elements below said first sub-area and at least one of said second plurality of circuit elements below said second sub-area.

2. The semiconductor device of claim 1, wherein said stress relaxation region extends into said device substrate.

3. The semiconductor device of claim 2, wherein said stress relaxation region extends through said device substrate.

4. The semiconductor device of claim 1, wherein said stress relaxation region comprises a fill material having a coefficient of thermal expansion that differs from a coefficient of thermal expansion of said semiconductor material.

5. The semiconductor device of claim 1, wherein said fill material has a coefficient of thermal expansion that is substantially equal to a coefficient of thermal expansion of said package substrate.

6. The semiconductor device of claim 1, further comprising one or more additional pluralities of circuit elements formed in and above said device substrate, wherein said stress relaxation region defines at least one or more additional sub-areas of said metallization system formed respectively above each of said at least one or more additional pluralities of circuit elements and separates each of said at least one or more additional sub-areas from each of said first and second sub-areas, wherein at least some of said at least one or more additional sub-areas are electrically connected by one or more metal lines of said one or more metallization layers.

7. The semiconductor device of claim 1, further comprising a bump structure, wherein said bump structure connects said package substrate to said final contact layer.

8. The semiconductor device of claim 1, wherein at least one of said one or more metallization layers comprises a dielectric material having a dielectric constant of approximately 3.0 or less.

9. The semiconductor device of claim 1, wherein said stress relaxation region has a width in the range of approximately 1-50 µm.

10. The semiconductor device of claim 1, wherein said metal line portion represents a non-linear line portion.

11. The semiconductor device of claim 1, wherein at least some of said circuit elements have a critical dimension of approximately 50 nm or less.

12. The semiconductor device of claim 1, wherein said stress relaxation region comprises a trench structure.

13. The semiconductor device of claim 1, wherein said stress relaxation region comprises an organic fill material.

14. A semiconductor device, comprising:
a plurality of transistor elements formed in and above a substrate comprising a semiconductor material;
a metallization system comprising a plurality of stacked metallization layers, wherein at least one of said stacked metallization layers comprises metal lines formed in a low-k dielectric material; and
an expansion gap extending through each of said plurality of stacked metallization layers and into said semiconductor material, wherein said expansion gap defines and separates a plurality of sub-areas of said metallization system, and wherein each of said plurality of sub-areas is formed above at least a portion of said plurality of transistor elements.

15. The semiconductor device of claim 14, further comprising metal line portions extending across said expansion gap in at least some of said metallization layers.

16. The semiconductor device of claim 15, wherein said metal line portions are non-linear to accommodate a variation in width of said expansion gap.

17. The semiconductor device of claim 14, wherein said expansion gap comprises a fill material having a coefficient of thermal expansion that differs from a coefficient of thermal expansion of said substrate.

18. The semiconductor device of claim 17, wherein said fill material is an organic material.

19. The semiconductor device of claim 14, wherein said expansion gap extends through said substrate.

20. The semiconductor device of claim 14, wherein a minimal critical design dimension of at least some of said plurality of transistor elements is approximately 50 nm or less.

21. The semiconductor device of claim 14, wherein said expansion gap comprises a trench structure.

* * * * *